(12) United States Patent
Soutar et al.

(10) Patent No.: US 9,072,203 B2
(45) Date of Patent: Jun. 30, 2015

(54) SOLDERABILITY ENHANCEMENT BY SILVER IMMERSION PRINTED CIRCUIT BOARD MANUFACTURE

(75) Inventors: Andrew McIntosh Soutar, London (GB); Peter Thomas McGrath, Mission Viejo, CA (US)

(73) Assignee: Enthone Inc., West Haven, CT (US)

( * ) Notice: Subject to any disclaimer, the term of this patent is extended or adjusted under 35 U.S.C. 154(b) by 3816 days.

(21) Appl. No.: 10/099,936

(22) Filed: Mar. 13, 2002

(65) Prior Publication Data

US 2002/0150692 A1 Oct. 17, 2002
US 2012/0052211 A2 Mar. 1, 2012

Related U.S. Application Data

(63) Continuation of application No. 08/939,656, filed on Sep. 29, 1997, now Pat. No. 6,395,329, which is a continuation of application No. 08/567,885, filed on Dec. 8, 1995, now abandoned.

(30) Foreign Application Priority Data

Dec. 9, 1994 (GB) .................................. 9425031.3

(51) Int. Cl.
| | | |
|---|---|---|
| B05D 5/12 | (2006.01) | |
| B05D 1/18 | (2006.01) | |
| C04B 41/51 | (2006.01) | |
| C23C 18/40 | (2006.01) | |
| H05K 3/24 | (2006.01) | |
| C23C 18/42 | (2006.01) | |

(52) U.S. Cl.
CPC *H05K 3/244* (2013.01); *B05D 5/12* (2013.01); *C23C 18/42* (2013.01); *Y10T 29/4913* (2015.01); *Y10T 29/49144* (2015.01)

(58) Field of Classification Search
USPC ........... 427/98, 125, 304, 307, 421, 405, 437, 427/443.1; 106/1.19, 1.23
See application file for complete search history.

(56) References Cited

U.S. PATENT DOCUMENTS

| 2,555,375 A | 6/1951 | Ruemmler |
| 2,684,328 A | 7/1954 | Matthews et al. |
| 2,777,810 A | 1/1957 | Ostrow |

(Continued)

FOREIGN PATENT DOCUMENTS

| AU | 50192/72 | 12/1971 |
| DE | 4316679 C1 | 7/1994 |

(Continued)

OTHER PUBLICATIONS

Russev, et al. (1983). "Immersion Silvering of Copper" *1252 Metal Finishing* 81(1): 27-30.

(Continued)

*Primary Examiner* — Brian K Talbot
(74) *Attorney, Agent, or Firm* — Senniger Powers LLP

(57) ABSTRACT

A process used during manufacture of printed circuit boards comprises protecting metal pads and/or through-holes to provide a tarnish-resistant and solderable coating. In the method, the pads and/or through-holes are bright-etched, metal plated, preferably by an immersion process, and treated with a tarnish inhibitor. The tarnish inhibitor may be incorporated into the immersion plating bath. The metal plating is usually with silver or bismuth and the pads and/or through-holes comprise copper.

10 Claims, 1 Drawing Sheet

(56) References Cited

U.S. PATENT DOCUMENTS

| | | | |
|---|---|---|---|
| 2,883,288 A | 4/1959 | Dobbs et al. | |
| 3,130,072 A | 4/1964 | Duva et al. | |
| 3,230,098 A | 1/1966 | Robinson | |
| 3,285,754 A | 11/1966 | Hopkin | |
| 3,294,578 A * | 12/1966 | Popeck | 427/437 |
| 3,330,672 A | 7/1967 | Kroll et al. | |
| 3,460,953 A | 8/1969 | Schwartz | |
| 3,468,804 A | 9/1969 | Perry | |
| 3,522,314 A | 7/1970 | Warner | |
| 3,531,315 A | 9/1970 | Golben | |
| 3,531,414 A | 9/1970 | Randell et al. | |
| 3,576,662 A | 4/1971 | Diebold et al. | |
| 3,612,963 A | 10/1971 | Piper et al. | |
| 3,622,385 A | 11/1971 | Stork | |
| 3,993,845 A * | 11/1976 | Greenberg et al. | 428/433 |
| 4,024,031 A | 5/1977 | Lerner | |
| 4,067,784 A | 1/1978 | Leahy et al. | |
| 4,088,549 A | 5/1978 | Deuber et al. | |
| 4,177,114 A | 12/1979 | Suzuki et al. | |
| 4,246,077 A | 1/1981 | Hradil et al. | |
| 4,255,214 A | 3/1981 | Workens | |
| 4,265,715 A | 5/1981 | Rosegren et al. | |
| 4,368,223 A | 1/1983 | Kobayashi et al. | |
| 4,389,431 A | 6/1983 | Erismann | |
| 4,440,805 A | 4/1984 | Feldstein | |
| 4,478,691 A | 10/1984 | Abys | |
| 4,615,950 A | 10/1986 | Hung et al. | |
| 4,628,150 A | 12/1986 | Luc | |
| 4,666,735 A | 5/1987 | Hoover et al. | |
| 4,750,889 A | 6/1988 | Ignasiak et al. | |
| 4,755,265 A | 7/1988 | Young | |
| 4,777,078 A | 10/1988 | Miyabayashi | |
| 4,781,980 A | 11/1988 | Yoshitake et al. | |
| 4,800,132 A | 1/1989 | Grunwald et al. | |
| 4,821,148 A | 4/1989 | Kobayashi et al. | |
| 4,846,918 A | 7/1989 | Nelson et al. | |
| 4,873,139 A | 10/1989 | Kinosky | |
| 4,908,241 A | 3/1990 | Quast et al. | |
| 4,968,397 A | 11/1990 | Asher et al. | |
| 5,017,738 A | 5/1991 | Tsuji et al. | |
| 5,037,482 A | 8/1991 | Kukanskis et al. | |
| 5,049,718 A | 9/1991 | Spletter et al. | |
| 5,061,566 A | 10/1991 | Morgan | |
| 5,113,580 A | 5/1992 | Schroeder et al. | |
| 5,119,272 A | 6/1992 | Ohyama et al. | |
| 5,173,130 A | 12/1992 | Kinoshita et al. | |
| 5,178,909 A | 1/1993 | Hayashi | |
| 5,186,984 A | 2/1993 | Gabbert | |
| 5,196,053 A | 3/1993 | Dodd et al. | |
| 5,212,138 A | 5/1993 | Krulik et al. | |
| 5,219,815 A | 6/1993 | Krulik et al. | |
| 5,256,275 A | 10/1993 | Brasch | |
| 5,277,790 A | 1/1994 | Morrissey | |
| 5,322,553 A | 6/1994 | Mandich et al. | |
| 5,348,590 A | 9/1994 | Shigemura et al. | |
| 5,406,120 A | 4/1995 | Jones | |
| 5,468,515 A * | 11/1995 | Ferrier et al. | 427/98 |
| 5,480,576 A | 1/1996 | Gary et al. | |
| 5,498,301 A | 3/1996 | Hirao et al. | |
| 5,560,785 A | 10/1996 | Hirao et al. | |
| 5,583,375 A | 12/1996 | Tsubosaki et al. | |
| 5,612,512 A | 3/1997 | Wakamatsu et al. | |
| 5,725,640 A | 3/1998 | Joshi et al. | |
| 5,733,599 A | 3/1998 | Ferrier et al. | |
| 5,795,409 A | 8/1998 | Hirao et al. | |
| 5,876,517 A | 3/1999 | Jeannier | |
| 5,955,141 A | 9/1999 | Soutar et al. | |
| 6,200,451 B1 | 3/2001 | Redline et al. | |
| 6,319,543 B1 | 11/2001 | Soutar et al. | |
| 6,331,201 B1 | 12/2001 | McGrath et al. | |
| 6,444,109 B1 | 9/2002 | Redline et al. | |
| 6,860,925 B2 | 3/2005 | Soutar et al. | |
| 6,905,587 B2 | 6/2005 | Redline et al. | |

| | | |
|---|---|---|
| 2002/0150692 A1 | 10/2002 | Soutar et al. |
| 2011/0192638 A1 | 8/2011 | Soutar et al. |
| 2011/0279991 A1 | 11/2011 | Soutar et al. |

FOREIGN PATENT DOCUMENTS

| | | |
|---|---|---|
| EP | 0 081 183 | 11/1982 |
| EP | 0 797 380 A1 | 9/1997 |
| GB | 602591 | 5/1948 |
| GB | 2 201 163 | 8/1988 |
| JP | 5127819 | 3/1976 |
| JP | S53-134759 | 11/1978 |
| JP | S60-100679 | 6/1985 |
| JP | 03-002379 | 1/1991 |
| JP | 110474 * | 4/1992 |
| JP | 4110474 | 4/1992 |
| JP | 05-263258 | 10/1993 |
| JP | 08-255968 | 10/1996 |
| SU | 2753992/22-02 | 5/1981 |
| WO | WO 94/26954 | 11/1994 |
| WO | 96/17974 | 6/1996 |
| WO | 96/17975 | 6/1996 |

OTHER PUBLICATIONS

Geld (1960). "Finishing Pointers: Silver Plating of Electrical Contacts by Immersion." *Metal Finishing* p. 53 (August).

Lowenheim (1963). *Modem Electroplating* pp. 337 and 608-611. (London: John Wiley & Sons).

Request for Re-Examination of US 5,733,599 filed Sep. 14, 2012, Reexam Control No. 90/012,575, 186 pages.

Philpott, J.E., "Immersion Plating of Palladium, An Economic Process for the Deposition of Thin Tarnish-Resistant Coatings", Platinum Metals Rev., vol. 6, pp. 144-146 (1962).

Li, Fang Jing et al., Tarnish Protection for Silver Electrodeposits, Plating and Surface Finishing (Feb. 1988), pp. 58-61.

Ma, N.L., How strong is the Ag+ -ligand bond?, Chemical Physics Letters 297, Nov. 27, 1998, pp. 230-238.

Singh, Inder et al., Silver tarnishing and its prevention—A review, Anti-corrosion methods and materials, vol. 30, No. 7, Jul. 1983, pp. 4-8.

Ullman, Abraham, Formation and Structure of Self-Assembled Monolayers, Chem. Rev. 1996, vol. 96, No. 4, pp. 1533-1554.

Printout of PACER Docket Sheet on Dec. 1, 2011 regarding Civil Case No. 3:11-cv-00716-CSH (Cause No. 28:1338 Patent Infringement) entitled *MacDermid, Inc.* v. *Enthone, Inc.* In the United States District Court for the District of Connecticut (New Haven), 7 pages.

Litigation Search Report dated Aug. 11, 2011 from Patent Office regarding Reexam Control No. 90/009,932, 10 pages.

Litigation Search Report dated Aug. 12, 2011 from Patent Office regarding Reexam Control No. 90/009,933, 8 pages.

Litigation Search Report dated Sep. 2, 2011 from Patent Office regarding Reexam Control No. 90/009,934, 21 pages.

Enthone's Brief in Opposition to MacDermid's Motion for Summary Judgment filed Nov. 28, 2011 regarding Civil.Case No. 3:11-cv-00716-CSH entitled *MacDermid, Inc.* v. *Enthone, Inc.* In the United States District Court for the District of Connecticut (New Haven), 28 pages.

Record before the United States Patent and Trademark Office Board of Patent Appeals and Interferences entitled *Enthone, Inc.* v. *Macdermid, Inc.*, Patent Interference No. 105,738 (RES), Bates Labeled IR00000001 through IR00002064. (This will be uploaded to EFS in 5 Parts because of size restriction).

Local Rule 56(a)2 Statement filed Nov. 29, 2011 regarding Civil Case No. 3:11-cv-00716-CSH entitled *MacDermid, Inc.* v. *Enthone, Inc.* In the United States District Court for the District of Connecticut (New Haven), 7 pages.

Memorandum of Law in Support of MacDermid's Motion for Summary Judgment filed Nov. 4, 2011 regarding Civil Case No. 3:11-cv-00716-CSH entitled *MacDermid, Inc.* v. *Enthone, Inc.* In the United States District Court for the District of Connecticut (New Haven), 38 pages.

Supplemental Information Disclosure Statement filed Dec. 8, 2011 regarding U.S. Appl. No. 13/092,631, 10 pages.

(56) References Cited

OTHER PUBLICATIONS

Letter to Patent Office regarding Supplemental Information Disclosure Statement filed Dec. 8, 2011 for U.S. Appl. No. 13/092,631, 6 pages.
Appendix A to Supplemental Information Disclosure Statement filed Dec. 8, 2011 regarding U.S. Appl. No. 13/092,631, 3 pages.
Supplemental Information Disclosure Statement filed Dec. 8, 2011 regarding U.S. Appl. No. 13/187,248, 10 pages.
Letter to Patent Office regarding Supplemental Information Disclosure Statement filed Dec. 8, 2011 for U.S. Appl. No. 13/187,248, 10 pages.
Appendix A to Supplemental Information Disclosure Statement filed Dec. 8, 2011 regarding U.S. Appl. No. 13/187,248, 3 pages.
Non-Final Office Action dated Sep. 30, 2011 regarding U.S. Appl. No. 90/009,933, 18 pages.
Amendment A filed Nov. 30, 2011 regarding Reexam Control No. 90/009,933, 26 pages.
Notice of Reasons for Rejection filed on Dec. 16, 1997 regarding Japanese Application No. JP 7-348907, 5 pages.
Order Granting the Request for Ex Parte Reexamination regarding US Patent No. 6,395,329 (U.S. Appl. No. 90/009,932) dated Sep. 30, 2011, 11 pages.
Order Granting the Request for Ex Parte Reexamination regarding US Patent No. 6,860,925 (U.S. Appl. No. 90/009,933) dated Sep. 30, 2011, 12 pages.
Order Granting the Request for Ex Parte Reexamination regarding US Patent No. 5,955,141 (U.S. Appl. No. 90/009,934) dated Sep. 30, 2011, 14 pages.
Request for Ex Parte Reexamination regarding US Patent No. 5,955,141 dated Aug. 3, 2011, 162 pages.
Request for Ex Parte Reexamination regarding US Patent No. 6,395,329 dated Aug. 3, 2011, 155 pages.
Request for Ex Parte Reexamination regarding US Patent No. 6,860,925 dated Aug. 3, 2011, 187 pages.
Section 1.132 Declaration of Steven Castaldi dated Jan. 30, 2012, 9 pages.
Request for Inter Parties Reexamination Under 35 U.S.0 Section 311-318 of US Patent No. US 6,860,925 dated Feb. 1, 2012, 105 pages.

* cited by examiner

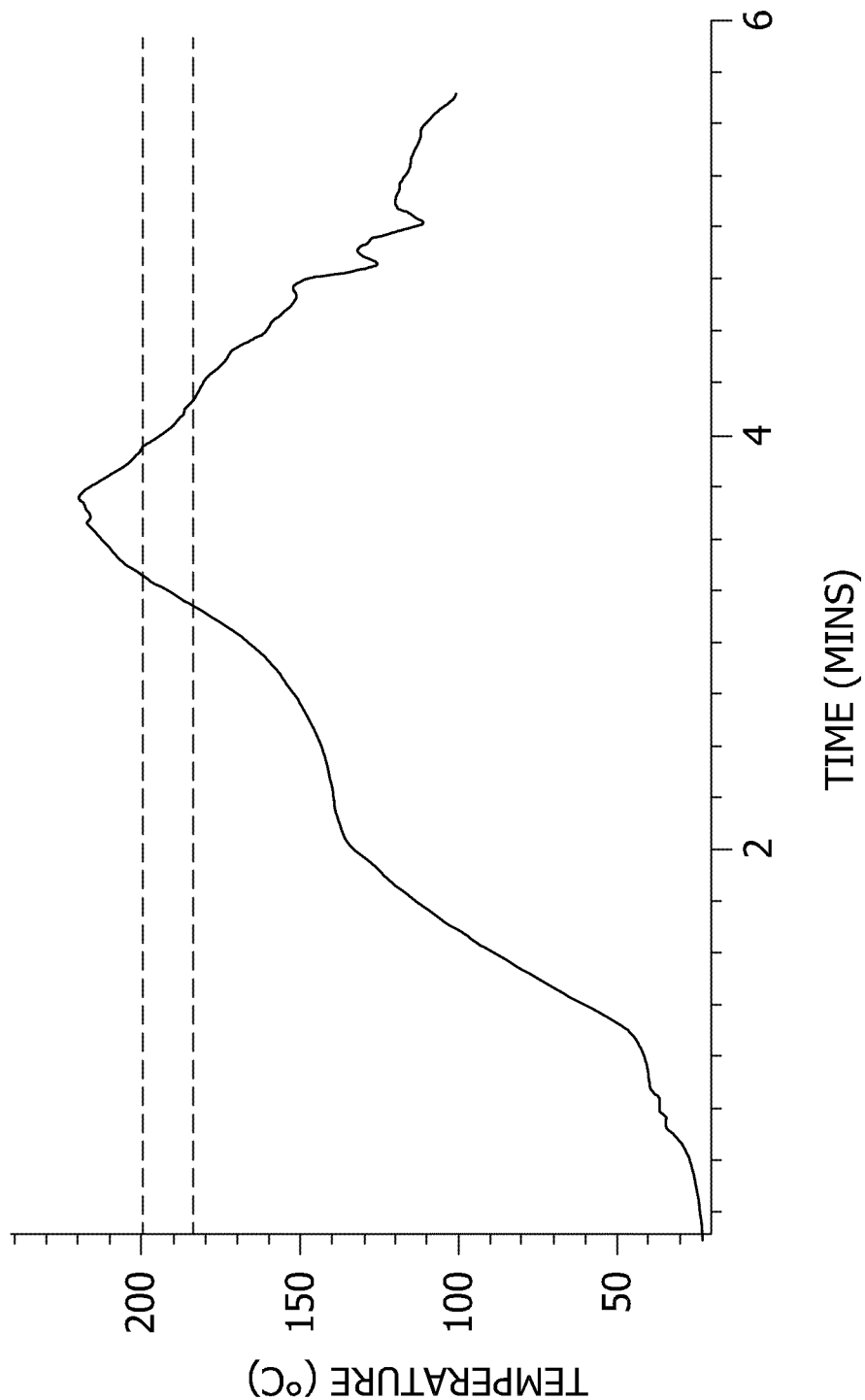

SOLDERABILITY ENHANCEMENT BY SILVER IMMERSION PRINTED CIRCUIT BOARD MANUFACTURE

RELATED APPLICATIONS

This application is a continuation of application Ser. No. 08/939,656, filed Sep. 29, 1997 now U.S. Pat. No. 6,395,329, which was a continuation of application Ser. No. 08/567,885, filed Dec. 8, 1995 now abandoned, which claimed priority to application Serial No. 9425031.3, filed on Dec. 9, 1994, in Great Britain.

FIELD OF THE INVENTION

In the production of a printed circuit board (PCB), in a first (multi-step) stage a "bare board" is prepared and in a second (multi-step) stage, various components are mounted on the board. The present invention relates to the final steps in the manufacture of the bare board, in which the bare board is coated with a protective layer prior to passing to the second production stage.

PRIOR ART

There are currently two types of components for attachment to the bare boards in the second stage referred to above: legged components e.g. resistors, transistors, etc., and, more recently, surface mount devices. Legged components are attached to the board by passing each of the legs through a hole in the board and subsequently ensuring that the hole around the leg is filled with solder. Surface mount devices are attached to the surface of the board by soldering with a flat contact area or by adhesion using an adhesive.

In the first stage referred to above, a board comprising an insulating layer, a conducting circuit pattern and conductive pads and/or through-holes is produced. The board may be a multi-layer board having more than one conducting circuit pattern positioned between insulating layers or may comprise one insulating layer and one conducting circuit pattern.

The through-holes may be plated through so that they are electrically conducting and the pads which form the areas to which the surface mount components will be attached in the subsequent component-attachment stage, are also electrically conducting.

The conductive areas of the circuit pattern pads and through-holes may be formed from any conductive material or mixtures of different conductive materials. They are generally however, formed from copper. Since over time copper tends to oxidise to form a copper oxide layer with poor solderability, prior to passing to the second, component-attachment stage a protective layer is coated over the pads and/or through-hole areas where it is desired to retain solderability to prevent formation of a poorly solderable surface layer of copper oxide.

While there is more than one way for preparing the bare board, one of the most widely used processes for making the bare boards is known as the "solder mask over bare copper" (SMOBC) technique. Such a board generally comprises an epoxy-bonded fiberglass layer clad on one or both sides with conductive material. Generally, the board will be a multi-layer board having alternate conductive layers which comprise circuit pattern, and insulating layers. The conductive material is generally metal foil and most usually copper foil. In the SMOBC technique, such a board is obtained and holes are drilled into the board material using a template or automated drilling machine. The holes are then "plated through" using an electroless copper plating process which deposits a copper layer on the entirety of the board: both on the upper foil surfaces and on the through-hole surfaces.

The board material is then coated with a light sensitive film (photo-resist), exposed to light in preselected areas and chemically developed to remove the unexposed areas revealing the conductive areas which are the plated through-holes and pads. Generally, in the next step, the thickness of the metal foil in the exposed areas is built up by a further copper electroplating step. A protective layer of an etch resist, which is usually a tin lead alloy electroplate composition is applied over the exposed and thickened copper areas.

The photo-resist is then removed exposing the copper for removal and the exposed copper surface is etched away using a copper etching composition to leave the copper in the circuit pattern finally required. In the next step, the tin-lead alloy resist is stripped away.

Since components will not be attached to the copper circuit traces, it is generally only necessary to coat the solder for attaching the components over the through-hole and pad areas but not the traces. Solder mask is therefore applied to the board to protect the areas where the solder coating is not required, for example using a screen printing process or photo-imaging technique followed by development and, optionally curing. The exposed copper at the holes and pads is then cleaned and prepared for solder coating and the protective solder coating subsequently applied, for example by immersion in a solder bath, followed by hot air leveling (HAL) to form a protective solder coating on the areas of copper not coated with solder mask. The solder does not wet the solder mask so that no coating is formed on top of the solder mask protected areas.

At this stage, the board comprises at least one insulating layer and at least one conductive layer. The conductive layer or layers comprise a circuit trace. The board also comprises a pad or pads and/or through-hole(s) protected from tarnishing by a layer of solder. A single conductive layer may comprise either a circuit trace or pad(s), or both. Any pads will be part of a conductive layer which is an outerlayer of a multi-layer board. The circuit traces on the board are coated with solder mask.

Such a board is ready to proceed to the second stage for attachment of the components. In this second stage, generally attachment of the components is achieved using solder: firstly a layer of solder paste (comprising solder and flux) is applied onto the boards, generally by printing and the components are positioned on the printed boards. The board is then heated in an oven to produce fusion of the solder in the solder paste, which forms a contact between the components and the board. This process is known as reflow soldering. Alternatively a wave soldering process is used in which the board is passed over a bath of molten solder. In either case additional solder is used over and above any protective solder coating.

The additional complications of attaching both legged components and the surface mount devices and the special requirements for mounting many small closely spaced components have resulted in increased demands on the surface protection coating for the conductive metal to which the components will be attached on the PCB's. It is essential that the finish applied by the bare board manufacturer does not leave a pad with an uneven surface as this increases the risk of electrical failure. It is also essential that the protective coating does not interfere with the subsequent solder step, thereby preventing formation of a good, conducting bond between the bare board and components. An extra step in which the protective coating is removed would be undesirable.

As explained above, the conductive metal surfaces are generally formed of copper and the protective surface must be applied at the end of the first stage to prevent the formation of non-solderable copper oxide on the copper surfaces prior to the component attachment. This is particularly important because, generally speaking, the first stage and the second, component-attachment stage will be carried out at completely different sites. There may therefore be a considerable time delay between formation of conducting pads and/or through-holes and the component-attachment stage, during which time oxidation may occur. Therefore, a protective coating is required which will retain the solderability of conducting material and enable a soldered joint to be made when the components are attached to the bare boards.

The most common protection coating presently used is tin/lead solder, generally applied using the "HAL" (hot air leveling) process, an example of which is described in detail above.

HAL processes are limited because it is difficult to apply the solder evenly and the thickness distribution produced by the use of HAL processes makes it difficult to reliably attach the very small and closely spaced components now being used.

Several replacement treatments for the HAL coating of a solder layer are being introduced. The coatings must enable formation of a reliable electrical contact with the component. They should also be able to stand up to multiple soldering steps. For example, as described above, there are now both legged and surface mount components for attachment to the bare boards and these will generally be attached in at least two soldering operations. Therefore, the protective coatings must also be able to withstand at least two soldering operations, so that the areas to be soldered in a second operation remain protected during the first operation.

Alternatives to the tin/lead alloy solder used in the HAL process, which have been proposed include organic protection, immersion tin or tin/lead plating and nickel/gold plating. In the nickel/gold process electroless plating of the copper surfaces is carried out in which a primer layer of nickel is applied onto the copper followed by a layer of gold. This process is inconvenient because there are many process steps and in addition, the use of gold results in an expensive process.

Organic protection for the copper pads during storage and assembly prior to soldering have also been effected using flux lacquer. Its use is generally confined to single-sided boards (i.e. boards which have conductive pads on only one side). The coating is generally applied by dip, spray or roller coating. Unfortunately, it is difficult to provide a consistent coating to the board surfaces so limited life expectancy, due to the porosity of the coating and to its inconsistent coating thickness, results. Flux lacquers have also been found to have a relatively short shelf life. A further problem is that in the component-attachment stage, if reflow soldering is to be used to attach the components, the components are held in place on the underside of the boards with adhesive. In cases where the flux lacquer is thick, the adhesive does not bond the component directly to the printed board, but instead forms a bond between the adhesive and the lacquer coating. The strength of this bond can drop during the fluxing and soldering step causing components to be lost during contact with the solder baths.

One other alternative currently being used is passivation/protection treatment based upon the use of imidazoles or triazoles in which copper-complex compounds are formed on the copper surface. Thus, these coatings chemically bond to the surface and prevent the reaction between copper and oxygen. However this process is disadvantageous because it tends to be inadequate for withstanding successive soldering steps so that the high temperatures reached in a first soldering step tend to destroy the layer which cannot withstand a subsequent soldering operation needed to mount further components. One example of such a process is given in EP-A-0428383, where a process is described for the surface treatment of copper or copper alloys comprising immersing the surface of copper or copper alloy in an aqueous solution containing a benzimidazole compound having an alkyl group of at least 3 carbon atoms at the 2-position, and an organic acid.

Processes are also known which provide coatings using compositions which comprise silver.

The three common complexing systems for electroless silver plating processes are either ammonia-based, thiosulphate-based or cyanide-based.

The ammonia systems are disadvantageous because the ammonia-containing silver solutions are unstable and explosive azides may tend to form. Thiosulphate systems are disadvantageous for use in the electronics industry because sulphur compounds in the silver coatings formed result in poor solderability so that in the subsequent component-attachment step, a poor electrical contact may be formed between the bare board and the component.

The cyanide-based systems are disadvantageous due to the toxicity of the plating solutions.

In U.S. Pat. No. 5,318,621 an electroless plating solution containing amino acids as rate enhancers for depositing silver or gold onto a nickel coating overlying copper on a circuit board is disclosed. It is described that neither gold nor silver electroless plating baths based on thiosulphate/sulphate will plate directly onto copper because the copper rapidly dissolves without allowing a silver or gold coating to form. In the introduction of the reference, "Metal Finishing Guidebook & Directory" (1993 edition), silver plating solutions comprising silver nitrate, ammonia and a reducing agent such as formaldehyde are mentioned.

U.S. Pat. No. 4,863,766 also discloses electroless silver plating, using a cyanide-based plating solution. In Metal Finishing (1983) 81(i), pp 27-30 Russev described immersion silvering of copper powder from a plating solution containing silver nitrate and a nitrogen complexing agent. In Metal Finishing (1960) August, p 53 Geld described a silver coating process involving an initial bright dip of the brass or copper substrate, followed by a silver plating step in which a thick coating of silver is plated from a solution of silver nitrate and potassium iodide. The process is for plating of electrical contacts to increase conductivity.

In JP-A-04-110474 a base material is plated with silver, dried and subsequently treated with a mercaptan compound to prevent tarnish.

In DE-C-4316679 base metals such as copper are coated with palladium in a two-step process including a first step in which the surface is contacted with a bath containing a palladium salt and an oxidizing agent, and in the second step with a bath containing a palladium salt, a complexing agent and formic acid or formic acid derivative. The latter bath may also contain stabilizers for the bath itself, which stabilize the bath against decomposition or "plating-out". It is suggested that the copper substrate should previously be etched using a non-bright etch bath including persulphate. However, such pretreatment steps tend to produce relatively porous coatings. The inventors there minimize the porosity of the coating by using the two-step process in the first of which a very thin coating is formed. This reference warns against using silver as corrosion protection due to migration.

The present invention relates to a displacement immersion metal plating in which a more electropositive metal displaces a less electropositive metal at the surface to be coated. Ions of the more electropositive metal oxidize the substrate metal. A displacement plating process differs from an electroless process because the silver coating forms on the surface of a metal by a simple displacement reaction due to the relative electrode potentials of the oxidisable metal of the surface to be protected and of the silver ions respectively.

It is reported in for example "Modern Electroplating" by F. A. Lowenheim, published by J. Wiley & Sons (1963) that silver will plate by displacement on most base metals but that immersion plated silver is poorly adherent. F. A. Lowenheim there suggests that when electroplating base metals with silver, it is necessary to deposit first a thin film of silver on the work piece from a high-cyanide strike bath to ensure good adhesion of the subsequent electroplated silver layer.

SUMMARY OF THE INVENTION

The present invention aims to provide an alternative to the solder protection coating for the copper or other conducting surfaces of bare boards which require protection from tarnishing between bare board manufacture and the component-attachment stage.

In accordance with the present invention, there is provided a method for coating a PCB comprising an insulating layer and a conducting layer, with metal pads and/or through-holes in which the pads and/or through-holes are provided with an anti-tarnish coating, the process comprising contacting the pads and/or through-holes with a bright-etch composition in a bright-etch step; and subsequently immersion plating the etched pads and/or through-holes in a metal-plating step to form solderable plated metal surfaces.

BRIEF DESCRIPTION OF THE DRAWINGS

FIG. 1 is a graphical representation illustrating an example described in the present application.

DESCRIPTION OF THE PREFERRED EMBODIMENTS

The insulating layer and conducting layer of the PCB will be as described immediately above. They may comprise the insulating layer and conducting circuit pattern of any conventional PCB, respectively. The pads and/or through-holes for plating are those areas of the PCB for which solderability must be maintained for attachment of components in the subsequent soldering steps for component attachment.

The bright-etch step comprises contacting the pads and/or through-holes with a bright-etch composition. Such compositions are already known in the industry for other applications and they produce a bright smooth cleaned surface on the conducting metal from which the pads and/or through-holes are formed. In contrast, non-bright etch compositions, such as those which are based on persulphate provide microroughened, cleaned surfaces. The use of the bright-etch step allows the formation of a dense, nonporous metal coating, which is particularly suitable for a subsequent soldering step.

Suitable bright-etch compositions are generally aqueous and may be based for example on one or mixtures of more than one of hydrogen peroxide, sulphuric acid, nitric acid, phosphoric acid or hydrochloric acid. The bright-etch compositions generally include at least one component which will tend to modify the dissolution of copper in bright-etch compositions.

Particularly preferred bright-etch compositions where the metal surface of the pads and/or through-holes comprises copper or a copper alloy are, for example, as described in JP 62-188785 A2 (comprising 5.1-10.2 moles/l nitric acid, 4.6-9.2 moles/l sulphuric acid, 0.01 moles/4 zinc nitrate and 0.4 moles/l copper nitrate in aqueous solution); JP 60-190582 (comprising for example 20-50% by weight sulphuric acid (96%), 10-25% by weight nitric acid (67.5%), 0.5-1% by weight hydrochloric acid (35%) and 0.5-1%, by weight non-ionic surfactant); U.S. Pat. No. 3,668,131 (comprising hydrogen peroxide, sulphuric acid and urea additives); Metal Finishing (February 1986), 84, (2), 67-70 (comprising sodium dichromate, sulphuric acid, hydrochloric acid, sodium diethyldithio carbonate); Trans Inst. Metal Finishing (Summer 1983), 61, (2), 46-49 (acidified hydrogen peroxide comprising hydrogen peroxide, sulphuric acid and stabilizer); Oberfläche Surf, (August 1979) 20, (8), 178-179 (comprising nitric acid and dodecyl pyridinium chloride); U.S. Pat. No. 4,510,018 (comprising sulphuric acid, hydrogen peroxide, fatty acid amine and ammonium compound); U.S. Pat. No. 4,459,216 (comprising 5-100 g/l hydrogen peroxide and 100-300 g/l sulphuric acid and aromatic stabilizer); JP 84-038308 (comprising 0.15-0.3 moles/l hydrochloric acid; 0.2-0.4 moles/l phosphoric acid and 0.02-0.1 moles/l sulphuric acid). Where the conducting material of the pads and/or through-holes comprises stainless steel, particularly preferred bright-etch compositions may be as described for example in WO 93-08317; JP 62-238379 A2; DE 1928307; or Tr. Gos. Nauchno-Issled. Proektn. Inst. Osnovn. Khim (1974), 36, 93-97. Where the conducting material is aluminium, a suitable bright-etch is as described in Met. Finishing (July 1986) 84, (7), 55-59.

Thus, any etch composition which provides a bright, cleaned surface may be used. In the bright-etch step, contact with the bright-etch composition may be by immersion, spray or any other coating technique, such as is described in any of the references above, for sufficient time and at a suitable temperature to enable a bright surface to form on the conducting material of the pads and/or through-holes. Generally the temperature for contact with the bright-etch composition will be ambient and the contact time will be from 5 seconds to 10 minutes, preferably at least 30 seconds, or even at least 2 minutes, and preferably for no greater than 5 minutes.

Generally after the etching step, there will be a post-rinse step comprising rinsing with deionized water and generally without drying, the bare boards then proceed directly to the plating step. Alternatively, an acid rinse step may be included, after the aqueous rinse.

The plating step is an immersion (or displacement) plating step. In an immersion plating step, the plating composition comprises metal ions of a metal which is more electropositive than the conducting material. The choice of metal ions in the immersion plating solution, therefore depends on the metal to be plated. Since the pads or through-holes generally comprise copper or nickel, suitable examples of plating metals include bismuth, tin, palladium, silver and gold; silver and bismuth ions are particularly preferred.

A particularly preferred immersion silver plating method is described in our copending British application filed on even date herewith under the application number 9425030.5, and subsequent U.S. Ser. No. 08/932,392.

As sources of plating metal ions, any water soluble metal salt may be used, for example nitrates, acetates, sulphates, lactates or formates. Preferably silver nitrate is used.

The metal plating ions are generally in the plating composition at a concentration of from 0.06 to 32 g/l (based on metal ions), preferably from 0.1 to 25 g/l, most preferably from 0.5 to 15 g/l.

Contact of the metal surface with the plating solution will generally be at temperatures of from 10 to 90° C., preferably 15 to 75° C., more preferably 20 to 60° C. For example, the temperature of contact with the plating solution will be from 15 to 50° C., most usually from 20 to 40° C.

Contact can be by any method, usually dip, spray or horizontal immersion coating. Spray coating is preferred. Such contact may be part of a substantially continuous coating process.

The contact time of the plating solution with the metal surface is sufficient to form plated metal surfaces over the metal. Generally the contact time will be from 10 seconds to 10 minutes. A contact time of less than 10 seconds has generally been found to give insufficient coverage with silver coating and although the contact time may be longer than 10 minutes, no additional benefit has been found from a contact time of longer than 10 minutes.

The preferred plating process is an immersion displacement process and not a true electroless plating process. In the preferred plating compositions of the present invention, metal atoms on the surface of the metal are oxidized by the metal plating ions in the solution, so that a layer of plated metal deposits on the pads and/or through-holes. The process is self-limiting because when plated metal covers all of the surface sites of metal oxidizable by the plating metal no further reaction and therefore no further deposition occurs.

In a second aspect of the invention, there is provided for coating a PCB comprising an insulating layer and a conducting layer, with metal pads and/or through-holes in which the pads and/or through-holes are provided with an anti-tarnish coating, the method comprising metal plating the etched pads and/or through-holes by contact with a plating composition in a metal plating step to form solderable plated metal surfaces and contacting the plated metal surfaces with a solution of a tarnish inhibitor.

In this aspect of the invention, preferably, prior to contacting the metal surface with the plating composition in the plating step, the metal surface is cleaned. Cleaning may be using an acidic cleaning composition, such as any cleaning composition known in the art. Examples are copper conditioner PC 1144 supplied by Alpha Metals Limited of the United Kingdom. Where there is a cleaning step using an acidic cleaning solution, generally there will be a rinsing step prior to contacting the metal surface with the plating solution. Preferably any pre-cleaning will include a bright-etch step. In both aspects of the invention, the tarnish inhibitor may be present in the plating solution itself so that the plating solution comprises the solution comprising tarnish inhibitor. Thus, in a preferred method of the invention, the plated metal surfaces are contacted with a solution comprising a tarnish inhibitor during the plating step (i.e., contact may be during formation of the plated metal surfaces).

Alternatively, the metal surfaces are formed in the plating step and subsequently the formed metal surfaces are contacted with a solution comprising a tarnish inhibitor in a further step. The solution is preferably aqueous, being made up from deionized or otherwise purified water. The composition comprising tarnish inhibitor may additionally comprise solubilizers, for example nonaqueous solvents, surfactants and/or pH buffers.

Contact of the composition comprising tarnish inhibitor with the plated metal surfaces will be for at least 5 seconds, preferably for at least 20 seconds. Where the tarnish inhibitor is present in the plating solution, the time of contact is generally determined by the duration of the plating step. Generally, the contact time will be from 1 to 5 minutes. The temperature of contact is most usually from 10 to 90° C., preferably 15 to 75° C., more preferably 20 to 60° C. For example the temperature of contact with the plating solution may be from 15 to 50° C., most usually from 20 to 40° C. Contact may be any conventional means, for example by dip, spray or horizontal immersion coating.

The most appropriate pH depends to some extent on the particular tarnish inhibitor used but primarily on the metal ions present in a plating bath which contains the tarnish inhibitor. Where the tarnish inhibitor is contacted in a separate step with the plated metal surface, the pH should be appropriate for the tarnish inhibitor and selected so that it does not attack the plating. Where the solution is a silver plating composition, a convenient pH is in the range of 3 to 10. Where the solution is a bismuth plating composition, the pH may be 1 or lower.

The solution comprising the tarnish inhibitor may be a final rinse solution, applied to the boards prior to drying of the boards. The board may undergo subsequent treatment steps after contact with the composition comprising tarnish inhibitor. However, generally, after contact with the solution, comprising a tarnish inhibitor and drying, they are at the end of the first bare board manufacturing stage, and are ready for the second component-attachment stages. Optionally, for example, there may be a deionized water rinse step, prior to drying.

The concentration of tarnish inhibitor in the solution comprising tarnish inhibitor will generally be from 0.0001 to 5% by weight, i.e., 0.001 to 50 g/l. Preferably, the amount of tarnish inhibitor will be from 0.005 to 3% by weight, and most preferably from 0.01 to 2% by weight, or even below 1% by weight.

The method of the second aspect of the invention may surprisingly also be used on precious metals such as gold, platinum or ruthenium where it will improve solderability.

In the second aspect of the invention, the metal plating step is preferably an immersion/displacement plating or electroless plating step. It consists of a single step using a single plating composition. Most preferably the plating step will be an immersion/displacement plating step comprising contacting the metal of the pads and/or through-holes with an immersion plating composition.

Where the plating is other than by the preferred immersion/displacement process, for example, if it is by electroless plating, the plating composition may comprise alternative plating metal ions, such as nickel.

The use of tarnish inhibitor in the invention has been found to provide metal coatings which have good tarnish resistance (resistance to humidity and oxidation) even when stored at 40° C. and 93% RH for 96 hours or at 150° C. for 2 hours. The porosity inherent in immersion coatings is reduced by the provision of a level surface using the bright-etch step and using, so that the, anti-tarnish properties are considerably improved, even at the high temperatures reached in reflow soldering processes. Concern over the use of silver plating as described for example in DE-C-4316679 due to migration of silver ions is overcome as it has been found that the present invention substantially prevents silver migration by providing a barrier to moisture.

In both the above aspects of the invention, an immersion plating composition preferably contains a completing agent for the ions of the more electropositive metal.

In a further aspect of the present invention there is provided a displacement metal plating process in which a relatively less electropositive base metal is plated with a relatively more electropositive coating metal by contact with an aqueous plating composition containing ions of the more electropositive metal, a complexing agent for such ions and a tarnish inhibitor for the more electropositive metal so as to form a coating of the more electropositive metal.

In this aspect of the invention there is also provided a new plating composition containing ions of a metal which can be displacement plated, a complexing agent for the ions, preferably present in higher than equimolar amounts as compared to the metal ion, and containing a tarnish inhibitor for the metal, and being substantially free of reducing agent capable of reducing the ions to the metal.

This aspect of the invention has been found to be particularly useful for silver or bismuth plating. Therefore preferably, the plating composition described contains silver or bismuth ions.

The plating composition used in this aspect of the invention may be an immersion plating composition based on any plating composition used in the PCB industry.

In this embodiment of the invention, preferably, prior to contacting the metal surface with the plating composition in the plating step, the metal surface is cleaned. Cleaning may be accomplished using an acidic cleaning composition, such as any cleaning composition known in the art. Examples are copper conditioner PC 1144 supplied by Alpha Metals Limited.

Where there is a cleaning step using an acidic cleaning solution, generally there will be a rinsing step prior to contacting the metal surface with the plating solution.

Preferably any pre-cleaning will include a bright-etch step.

The plating composition may also comprise a complexing agent. If so, the complexing agent is preferably present in an amount of from 0.1 to 250 g/l preferably from 2 to 200 g/l and most preferably from 10 to 100 g/l, especially around 50 g/l. The complexing agent may be any complexing agent for the plating metal ions which does not form a water insoluble precipitate under the aqueous and pH conditions of the composition. Mixtures of complexing agents may also be used. It is desirable to use complexing agents which are bi-dentate or higher dentate ligands since the stability constants of such complexes are higher than mono-dentate ligands.

Examples of suitable complexing agents have oxygen-containing ligands, for instance amino acids and their salts, preferably having at least 2 and up to 10 carbon atoms, polycarboxylic acids, usually amino acetic acids, such as nitrilotriacetic acid or, usually, alkylene polyamine polyacetic acids including ethylene diamine tetraacetic acid (EDTA), diethylene triamine penta-acetic acid, N-hydroxyethyl ethylene diamine triacetic acid, 1,3-diamino-2-propanol-N,N,N',N,'-tetra-acetic acid, bishydroxyphenylethylene diamine diacetic acid, diamino cyclohexane tetra-acetic acid or ethylene glycol-bis-[(β-aminoethylether)-N,N'-tetra-acetic acid)] and N,N,N',N'-tetrakis-(2-hydroxypropyl)ethylene diamine, citrates and/or tartrates, N,N-di-(hydroxyethyl)glycine, gluconates, lactates, citrates, tartrates, crown ethers and/or cryptands.

Particularly preferred complexing agents for silver are EDTA, DTPA and N,N,N',N'-tetrakis-(2-hydroxypropyl)ethylene diamine. The complexing agent should form a soluble complex with plating metal ions in aqueous solution under the pH conditions of the plating solution.

A suitable complexing agent for bismuth is chloride, and it is generally unnecessary to use a multidentate (i.e., bi- or higher dentate) ligand complexing agent for bismuth.

The complexing agent is preferably used either in stoichiometric equivalent amounts or in a stoichiometric excess so that all the plating metal ions may be complexed. By stoichiometric we mean equimolar. Preferably the complexing agent is present in a higher molar concentration than the silver ions, the molar ratio preferably being (at least 1.2):1, more preferably (at least 2.0):1, more preferably (at least 3):1.

Suitable tarnish inhibitors for use in all aspects of the present invention include for example:

(a) fatty acid amines, preferably having at least 6 carbon atoms, most preferably at least 10 carbon atoms and generally no greater than 30 carbon atoms, they may be primary, secondary, tertiary, diamines, amine salts, amides, ethoxylated amines, ethoxylated diamines, quaternary ammonium salts, quaternary diammonium salts, ethoxylated quaternary ammonium salts, ethoxylated amides and amine oxides. Examples of the primary, secondary and tertiary amine-type corrosion inhibitors are ARMEEN™ to (™ denotes trademark). Examples of the subsequent amine-type corrosion inhibitors are respectively DUOMEEN™, ARMAC™/DUOMAC, ARMID™, ETHOMEEN™, ETHODUONEEN™, ARQUAD™, DUOQUAD™, ETHOQUAD™, ETHOMID™, AROMOX™, all supplied by Akzo Chemie.

(b) purines and substituted purines.

(c) N-acyl derivatives of sarcosine, such as the SARKOSY range of products supplied by Ciba-Geigy.

(d) organic polycarboxylic acids such as Reocor 190 supplied by Ciba-Geigy.

(e) substituted imidazoline in which substituents are for example hydroxyl $C_{1-4}$ alkyl amino or carbonyl-containing groups. Examples include AMINE 0, produced by Ciba-Geigy, especially in combination with a N-acyl sarcosine of category (c).

(f) alkyl or alkyl benzyl imidazoles, e.g. undecyl imidazole in which the alkyl group has up to 22 carbon atoms, preferably no greater than 11 carbon atoms and in which the alkyl or benzyl groups are optionally substituted.

(g) benzimidazoles, especially alkylaryl benzimidazoles in which the alkyl group has up to 22 carbon atoms, preferably no greater than 10 carbon atoms and in which the alkyl or benzyl groups are optionally substituted, for example 2-(p-chlorobenzyl)benzimidazole which is particularly preferred.

(h) phosphate esters such as EKCOL PS-413, supplied by Witco.

(i) optionally substituted triazole derivatives such as REOMET 42, supplied by Ciba-Geigy. Examples are benzo triazole, tolyl triazole and alkyl substituted triazole derivatives having a carbon number on the alkyl group of from 1 to 22, preferably from 1 to 10.

(j) substituted tetrazoles, such as 5(3(trifluoromethyl phenyl))tetrazole, is also a preferred example.

The choice of tarnish inhibitor will depend to some extent upon the metal of the plated metal surfaces, but this will be clear to a person skilled in the art. For example, if the tarnish inhibitor is to be incorporated into a gold plating bath, the tarnish inhibitor may be a chloride salt, however, in contrast, using a silver plating bath, chloride salts may not be used as they will result in formation of an insoluble silver chloride precipitate.

The tarnish inhibitor is preferably water soluble so that the solution is an aqueous solution. However, water immiscible tarnish inhibitors may be used although it may be necessary to include a surfactant/cosolvent in the solution.

This invention has been found to provide considerable advantages in preventing tarnishing and conferring humidity resistance on the bare boards produced so that additional protection is provided between the bare board manufacture stage and the component-attachment stage. Solderability is found to be enhanced.

A suitable pH for a silver plating composition may be from 2 to 12, but is preferably from 4 to 10. Thus, the composition may be acidic, up to pH 7. Alternatively, the composition may be alkaline, and have a pH of greater than 7, or even greater than 7.5. A bismuth plating solution usually has a low pH of 1 or less.

A buffering agent may be included in the plating composition to ensure that the pH of the composition is within the desired range. As the buffering agent, any compatible acid or base may be included. A compatible acid or base is an acid or base which in the amounts required in the composition does not result in the precipitation out of solution of the silver ions and/or complexing agent. For example hydrogen chloride is unsuitable for a silver plating composition as it forms an insoluble silver chloride precipitate. Suitable examples include sodium or potassium hydroxide or a carbonate salt, or where acids are required, suitable acids may include citric acid, nitric acid or acetic acid. Borates, phthalates, acetates, phosphonates may be used but the buffer should not result in precipitation of the metal salts and preferably does not inhibit the plating rate. An appropriate buffer will be dependent on the desired working pH.

The plating composition may include optional ingredients such as surfactants or wetting agents to improve the coating uniformity. Where surfactants are included, preferably they are introduced into the composition in an amount such that in the plating bath, they will be present at a concentration of from 0.02 to 100 g/l. Preferably they will be incorporated at a concentration of from 0.1 to 25 g/l and most preferably at a concentration of from 1 to 15 g/l. Any standard surfactant or wetting agent useful in a plating bath may be used. Nonionic surfactants are preferred. Particularly preferred surfactants are alkyl phenol ethoxylates, alcohol ethoxylates and phenol ethoxylates such as *Synperonic NP9 (ex. ICI), *Synperonic A14 (ex. ICI) and *Ethylan HB4 (ex. Harcros), respectively (*denotes trade name).

A further optional ingredient which can be included in the plating baths of the present invention are grain refiners. Grain refiners improve the appearance of the plated metal surfaces by causing formation of smaller crystals of plated metal having a more densely parked structure. Suitable examples of grain refiners include lower alcohols such as those having from 1 to 6 carbon atoms, for example isopropanol and polyethylene glycols, for example PEG 1450 (Carbowax* Union Carbide). Grain refiners may be incorporated in the composition in amounts from 0.02 to 200 g/l. More preferably, if a grain refiner is included, it will be at concentrations of from 0.05 to 100 g/l and most preferably from 0.1 to 10 g/l. Any nonaqueous solvent should be present in amounts below 50% by weight of the composition, preferably below 30% by weight or even below 10% or 5% by weight of the plating composition.

Other non-active, non-interfering components may be included such as defoamers especially for spray applications (e.g., A100 supplied by Dow), dyes, etc.

The balance in the composition is water. Deionized water or other purified water which has had interfering ions removed, is used in the plating composition used in the process of the invention.

In order to form the plating composition for use in the processes of the present invention, preferably a solution is firstly prepared comprising deionized water, complexing agent as defined above, and any buffering agent, optionally with the other optional ingredients, and a salt of the more electropositive metal is added as an aqueous solution to the other components which have been formed into a pre-mix. It has been found that this is the most advantageous way to prepare the solution because trying to dissolve the metal salt directly into the plating composition is relatively time consuming and, where the metal is silver, tends to be more vulnerable to photo-reaction which results in precipitation of silver ions out of solution, as a dark precipitate.

Preferably the pH of the composition to which a silver salt is added will be from pH 3 to 10, most preferably from 4 to 8.

The components are mixed until they have substantially dissolved. The use of heat for silver dissolution is disadvantageous because again, it may tend to cause the formation of a dark silver precipitate.

After contact of the bare board with the solution comprising tarnish inhibitor, the board is dried. Preferably, there will be no post-rinse step between contact of the board with the solution and drying.

Drying may be by any means, but is generally using warm air, for example treated metal may be passed through a drying oven.

The coating obtained using the method of the present invention produces a surface which is considerably more uniform and even than that obtained in the conventional HAL processes and, compared with organic protection, the coating is more resistant to soldering operations. Furthermore, the process of this invention is less expensive and simpler than use of the nickel/gold process.

In the subsequent component-attachment stage, the components are soldered onto the plated pads and/or through-holes of the bare board. The metal of the pad(s) and/or through-holes (generally copper) and plating metal, usually silver, and/or the plating metal and solder may tend to intermix. The bond formed with the components has good electrical conductivity and good bond strength.

After component attachment, finished boards having components attached over the plated layer of the present invention, do not suffer joint reliability problems as do those boards formed using a nickel/gold step.

Example 1

A composition was prepared in which 50 g EDTA and 20.4 g of solid sodium hydroxide were mixed with sufficient water to dissolve them. A solution comprising 1 g silver nitrate in deionized water was subsequently added to the premixture comprising EDTA and sodium hydroxide solution and deionized water was added to 1 liter. Copper double-sided circuit boards, having a variety of surface mount feature and plated through-holes of various diameter were coated with the silver solution using the following procedure.

Boards were chemically brightened in an aqueous solution of 20% v/v $H_2O_2$ (35%), 0.5% v/v $H_2SO_4$, (96%), 2.5% 1,4-butanediol for 1 minute. A tap water rinse was then employed, followed by an acid rinse in 10% $H_2SO_4$, for 1 minute. The boards were given a further water rinse, then immersed in the silver plating solution at 40° C. for 4 minutes. After removal from the bath, the boards were rinsed with water and warm air dried. Copper areas of the board were coated with a bright, even silver deposit.

Coated boards were subjected to three passes through a typical IR silver paste reflow profile (see FIG. 1), then wave soldered using NR300, an Alpha Metals VOC free, no clean flux. 100% filing of the plated through-holes with solder was achieved.

Further boards were stored in a humidity cabinet at 40° C./93% RH for 24 hours before being passed through 3 IR reflow profiles. These boards showed a slight degree of tarnishing on the silver coating. However 100% hole filling was still achieved during subsequent wave soldering with NR 300 flux.

Example 2

A silver plating solution was prepared by forming a solution comprising 50 g EDTA, 20.4 g NaOH, 14 g Ethylan HB4 (Akros Chemicals), 3 g Crodamet $O_2$ (Croda Chemicals) in 800 mls deionized water. To this solution was added a solution of 1 g $AgNO_3$ in 100 mls deionized water. The pH was adjusted to 6.8 by addition of dilute $NaOH/HNO_3$, then made up to 1 liter with deionized water.

Double sided bare copper boards were coated with the above solution using the procedure as described in Example 1. 100% filling of plated through-holes with solder was achieved during wave soldering with NR300 flux after passage through 3 IR reflow profiles.

Boards stored at 40° C./93% RH for 24 hours prior to passage through 3 IR reflow profiles showed no evidence of tarnishing and soldered well during wave soldering trials, giving 100% hole filling.

Example 3

Double-sided bare copper boards were coated using the bath composition and procedure as described in Example 1. Following removal of the boards from the silver plating solution and rinsing, the boards were immersed in a solution of 4 g Reomet 42 (Ciba-Geigy) in 1 liter deionized water (pH 7) for 1 minute at room temperature. The boards were then rinsed in tap water and warm air dried. A bright even silver coating was produced.

The coated boards were stored at 40° C./93% RH for 24 hours then passed through 3 IR paste reflow profiles. The boards showed no evidence of tarnishing, and soldered well when wave soldered using KR 300 flux.

Example 4

Coupons of copper strip (5 cm×1 cm) were coated with the silver coating as described in Example 2. In addition, further samples were coated with immersion tin, 63/37 Sn/Pb and two competitors solderability preservative coatings based on substituted benzimidazole chemistry. The following coating procedures were applied for the various samples:

Immersion Tin Coating

Coupons were etched in an aqueous solution of $Na_2S_2O_8$ (5%), $H_2SO_4$ (5%) for 2 minutes, rinsed with tap water, then rinsed with 10% $H_2SO_4$ for 1 minute and then rinsed with deionized water. The coupons were then immersed in an immersion tin plating solution comprising 0.33 g/l $Sn(BF_4)_2$, 150 g/l thiourea, 20 g/l fluoroboric acid and 5 g/l Synparonic NP9 (ex. ICI) in deionized water, for 1 minute at room temperature. The coupons were then rinsed with deionzed water and warm air dried.

Sn/Pb Coating

Coupons were etched in an aqueous solution comprising $Na_2S_2O_8$, (5%) and $H_2SO_4$ (5%) rinsed with tap water then with 10% $H_2SO_4$ and then with deionized water. The coupons were warm air dried. Alpha NR 300 flux was then applied to each coupon. The coupons were then coated 63/37 Sn/Pb by immersion in molten solder at 250° C. for 3 seconds.

Azole 1 and Azole 2

Coupons were etched and rinsed as for the immersion tin samples. Coupons were then immersed in the solution containing the azole at 40° C. for 90 seconds. After removal from the azole containing solution, the coupons were rinsed with deionized water, and warm air dried.

The coupons were subjected to a variety of different pre-treatments.
A. No pre-treatment.
B. Passage through 3 solder paste reflow profiles.
c. Storage at 40° C./93% RH for 96 hours.
D. Storage at 40° C./94% RH for 96 hours, then 3 solder paste reflow profiles.
E. Storage at 150° C. for 2 hours.

Samples were then soldered using a meniscograph with NR300 flux.

The meniscograph test method monitors the solderability by measuring the net force acting between specimen and solder. The coatings are assessed by the length of time to reach zero wetting force, and the size of the equilibrium wetting force. To achieve good results in wave soldering a short wetting time and high equilibrium wetting force are preferred.

The table below shows the wetting times in seconds and wetting forces after 2 seconds immersion in mN/mm for various copper coated samples.

As can be seen from above, the silver coatings prepared according to this invention have shorter wetting times and higher wetting forces than the Sn and benzimidazole alternative and retain these properties more readily after humidity and heat treatment.

TABLE 1

| Coating | Pre-Treatment | Wet Time/Sec | Wetting Force at 2 Seconds |
| --- | --- | --- | --- |
| Example 2 | A | 0.7 | 0.429 |
| Example 2 | B | 0.8 | 0.444 |
| Example 2 | C | 0.7 | 0.429 |
| Example 2 | D | 0.7 | 0.441 |
| Example 2 | E | 0.8 | 0.438 |
| Tin | A | 0.9 | 0.488 |
| Tin | B | >5 | −0.028 |
| Tin | C | >5 | 0.008 |
| Tin | D | >5 | −0.148 |
| Azole 1 | A | 0.8 | 0.439 |
| Azole 1 | B | 0.9 | 0.412 |
| Azole 1 | C | 0.9 | 0.443 |
| Azole 1 | D | 0.9 | 0.426 |
| Azole 1 | E | 1.0 | 0.421 |
| Azole 2 | A | 0.9 | 0.449 |
| Azole 2 | B | 1.0 | 0.417 |
| Azole 2 | C | 0.9 | 0.466 |
| Azole 2 | D | 1.1 | 0.310 |
| Azole 2 | E | 1.2 | 0.296 |
| Sn/Pb | A | 0.8 | 0.475 |
| Sn/Pb | B | 0.8 | 0.501 |
| Sn/Pb | C | 0.8 | 0.492 |
| Sn/Pb | D | 0.8 | 0.474 |
| Sn/Pb | E | 0.8 | 0.492 |

Example 5

A displacement bismuth plating composition was prepared comprising 3.9 g bismuth oxide, 183.1 g hydrogen chloride (as 37% solution), 490.5 g glycolic acid (70% solution), 265.4 g (50% sodium hydroxide solution), 0.077 g potassium iodide, 0.003 g Synperonic NP9 (ex. ICI) and 4 g 2p-chlorobenzyl benzimidazole, were added to deionized water to make 1 liter of product solution. Bare boards having copper pads and copper through-holes were chemically brightened as described in Example 1, then immersed in the plating baths for 2 minutes at 70° C. A coating of bismuth was formed on the surface of the copper having a thickness of 0.05 µm. Subsequent solderability and tarnish resistance tests carried out on the plated bare boards showed good results for solderability and tarnish resistance.

Example 6

Double-sided bare copper boards were bright etched in an aqueous solution of 50% v/v $HNO_3$, 10% $H_2SO_4$, 10% $H_3PO_4$, 1% HCl for 1 minute at room temperature. Boards were then rinsed in tap water followed by 10% $H_2SO_4$ for 1 minute. After a further water rinse, boards were immersed in silver plating bath described in Example 2 for 4 minutes at 45° C. Boards were then water rinsed and warm air dried. The coated boards were stored at 40° C./93% RH for 24 hours then passed through 3 IR paste reflow profiles. The boards showed no evidence of tarnishing when wave soldered using NR 300 flux.

Example 7

A silver plating bath was prepared by forming a solution comprising 64.8 g diethylene triamine penta-acetic acid, 23.0 g NaOH, 24 g surfactant Ethylan HB4 (Akros Chemicals), 2.5 g Crodamet $O_2$ an ethoxylated 3° amine compound (Croda Chemicals) in 800 mls deionized water. To this solution was added a solution of 1 g silver nitrate in 100 mls deionized water. The pH of this solution was adjusted to 6.9 by addition of dilute NaOH solution or nitric acid. The volume was then made up to 1 liter using deionized water.

Double-sided bare copper boards were coated using the above solution using the procedure as described in Example 1. 100% filling of the plated through-holes was achieved during wave-soldering of the coated boards using Alpha Metals MR300 flux after passage through 3 IR reflow profiles showed no evidence of tarnishing, and soldered well during wave-soldering trials giving 100% hole-fill.

Example 8

An immersion silver plating solution was prepared comprising 98.2 g deionized water, 1 g of nitric acid, 0.1 g of silver nitrate, 0.3 g of Chemeen C2 (antitarnish) and 0.4 g Mazawet DF (solubilizer). The pH was adjusted to 6 using a 50% solution of ethylene diamine. The bath produced an adherent silver deposit on copper coupons which showed good solderability and humidity resistance.

Example 9

A bismuth plating solution was prepared containing bismuth trioxide 2.1% weight, hydrochloric acid (22° Be) 46.73% weight, glycollic acid (70%) 49.5% weight, potassium chloride 0.07% weight, polyethylene glycol 600 0.1% weight, Chemax Chemeen C2 0.2% weight, distilled water 1.2% weight and tartaric acid 0.1% weight. A further solution was prepared from which the Chemeen C2 was omitted. Samples of copper clad printed circuit material were plated in each of the solutions. These plated samples were then placed in a humidity chamber for 16 hours at 60° C. and 95% relative humidity.

After this exposure the samples were examined, and those prepared in the solution without the Chemeen C2 were heavily tarnished. The samples prepared in the solution containing the tarnish inhibitor had a good appearance with minimal oxidation, and when tested showed good solderability.

Other embodiments of the invention are to be considered within the scope of the appended claims.

What is claimed is:

1. A process for improving the solderability of a metal surface, said process comprising treating the metal surface with an immersion silver plating solution, said solution comprising:
    a). a soluble source of silver ions;
    b). an acid;
    c). an additive selected from the group consisting of fatty amines, fatty amides, quaternary salts, and ethoxylated versions of any of the foregoing.

2. A process according to claim 1 wherein the silver plating solution also comprises material selected from the group consisting of imidazoles, benzimidazoles, imidazole derivatives and benzimidazole derivatives.

3. A process according to claim 1 wherein the metal surface comprises copper.

4. A process according to claim 3 wherein the silver plating solution also comprises a material selected from the group consisting of imidazoles, benzimidazoles, imidazole derivatives, and benzimidazole derivatives.

5. An immersion silver plating solution comprising
    (i) a soluble source of silver ions,
    (ii) an acid and
    (iii) an additive selected from the group consisting of fatty amines, fatty amides, quaternary salts, and ethoxylated versions of any of the foregoing.

6. An immersion plating solution according to claim 5 also comprising a material selected from the group consisting of imidazoles, benzimidazoles, imidazole derivatives, and benzimidazole derivatives.

7. A process for improving the solderability of a metal surface, said process comprising:
    a). contacting the metal surface with an immersion silver plating solution thereby producing an immersion silver plate upon the metal surface; and thereafter
    b). treating the immersion silver plated metal surface with a solution comprising an additive selected from the group consisting of fatty amines, fatty amides, quaternary salts, and ethoxylated versions of any of the foregoing.

8. A process according to claim 7 wherein the silver plating solution comprises a material selected from the group consisting of imidazoles, benzimidazoles, imidazole derivatives and benzimidazole derivatives.

9. A process according to claim 7 wherein the metal surface comprises copper.

10. A process according to claim 9 wherein the silver plating solution comprises a material selected from the group consisting of imidazoles, benzimidazoles, imidazole derivatives and benzimidazole derivatives.

* * * * *